US012660409B2

(12) United States Patent
Sakuma et al.

(10) Patent No.: US 12,660,409 B2
(45) Date of Patent: Jun. 16, 2026

(54) DISPLAY DEVICE AND METHOD FOR MANUFACTURING DISPLAY DEVICE

(71) Applicant: SHARP KABUSHIKI KAISHA, Sakai City (JP)

(72) Inventors: Jun Sakuma, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 420 days.

(21) Appl. No.: 18/288,288

(22) PCT Filed: Jun. 3, 2021

(86) PCT No.: PCT/JP2021/021199
§ 371 (c)(1),
(2) Date: Oct. 25, 2023

(87) PCT Pub. No.: WO2022/254655
PCT Pub. Date: Dec. 8, 2022

(65) Prior Publication Data
US 2024/0244885 A1 Jul. 18, 2024

(51) Int. Cl.
*H10K 50/11* (2023.01)
*H10K 59/12* (2023.01)
*H10K 59/122* (2023.01)
*H10K 59/17* (2023.01)

(52) U.S. Cl.
CPC ......... *H10K 50/11* (2023.02); *H10K 59/1201* (2023.02); *H10K 59/122* (2023.02); *H10K 59/12* (2023.02); *H10K 59/17* (2023.02)

(58) Field of Classification Search
CPC .. H10K 50/11; H10K 59/1201; H10K 59/122; H10K 59/17; H10K 59/12
See application file for complete search history.

(56) References Cited

U.S. PATENT DOCUMENTS

| | | | | |
|---|---|---|---|---|
| 11,387,228 | B2 * | 7/2022 | Lius | G02F 1/1533 |
| 2012/0098735 | A1 * | 4/2012 | Wu | G09F 9/302 |
| | | | | 345/33 |
| 2012/0326201 | A1 | 12/2012 | Ohnuma et al. | |
| 2016/0013437 | A1 | 1/2016 | Ohnuma et al. | |
| 2017/0062754 | A1 | 3/2017 | Ohnuma et al. | |
| 2025/0278005 | A1 * | 9/2025 | Shin | G02F 1/1679 |

FOREIGN PATENT DOCUMENTS

JP 2019-091724 A 6/2019

* cited by examiner

*Primary Examiner* — Richard A Booth
(74) *Attorney, Agent, or Firm* — ScienBiziP, P.C.

(57) ABSTRACT
A hole transport layer serving as a target layer includes a part of a region formed between a plurality of lower electrodes and a partition, and includes a first portion and a second portion across at least one of a non-formation portion of the target layer and a region where the target layer is thinner than the target layer on the plurality of lower electrodes in the reverse tapered portion.

17 Claims, 13 Drawing Sheets

2    22

FIRST STEP 21    24

Figure 11:
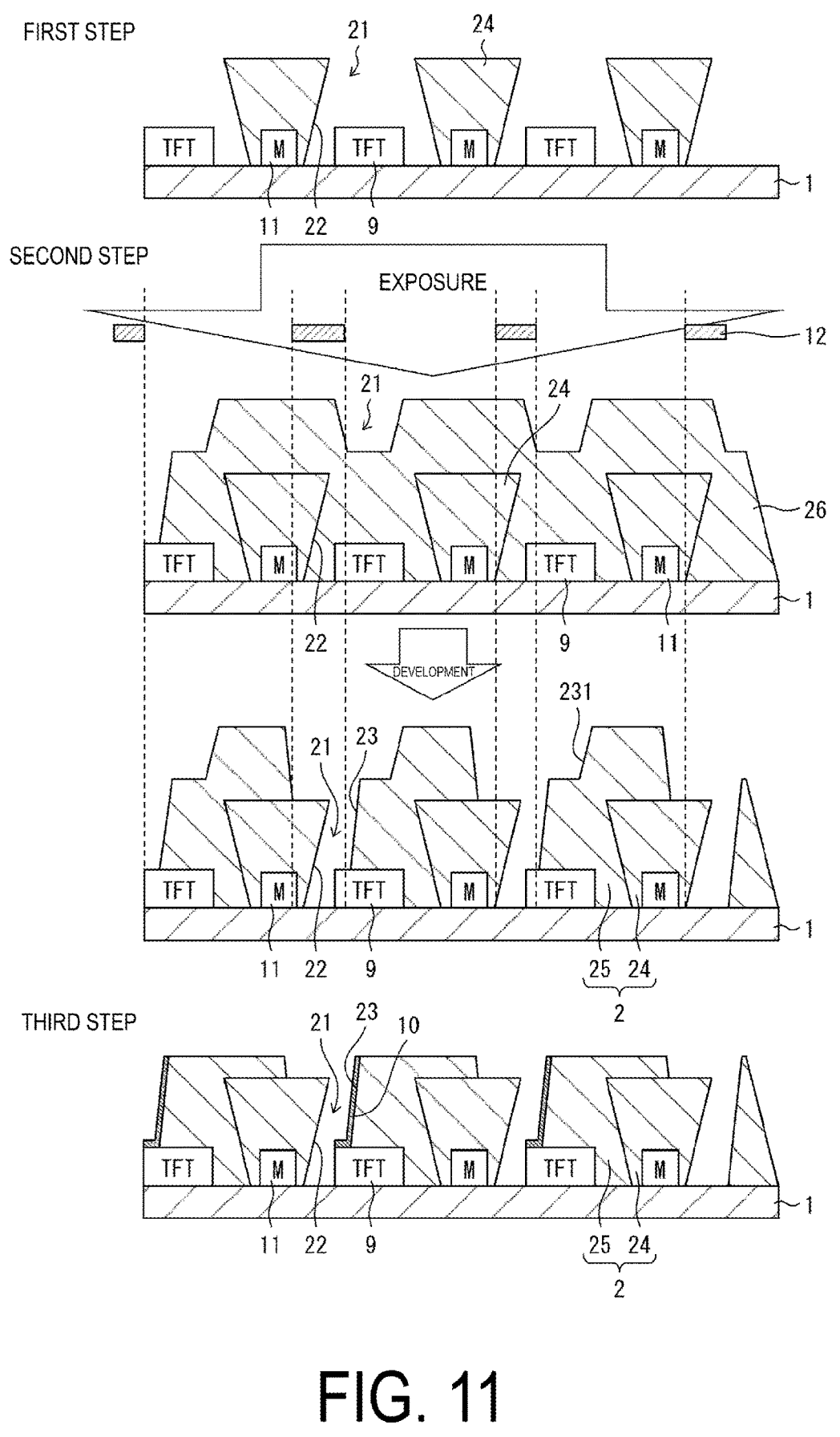

TFT   M   TFT   M   TFT   M

1

11  22  9

SECOND STEP

EXPOSURE

12

21    24

26

TFT   M   TFT   M   TFT   M

1

22        9    11

DEVELOPMENT

231

21  23

TFT   M   TFT   M   TFT   M

1

11  22  9        25  24

2

THIRD STEP 21  23  10

TFT   M   TFT   M   TFT   M

DISPLAY DEVICE AND METHOD FOR MANUFACTURING DISPLAY DEVICE

TECHNICAL FIELD

The disclosure relates to a display device and a manufacturing method of the display device.

BACKGROUND ART

Crosstalk may be a problem in organic light emitting diode (OLED) display devices and quantum dot light emitting diode (QLED) display devices. The crosstalk means that a plurality of subpixels unintentionally electrically interfere with each other. In the display devices, phenomena such as color mixing and reduction in efficiency occur due to the crosstalk.

As a cause of the crosstalk, for example, a plurality of electrodes provided to be separated from each other are electrically connected to each other by a carrier transport layer.

In PTL 1, by forming a side surface of a partition to have a reverse tapered shape, a layer containing an organic substance is made thin on the side surface of the partition, and thus the crosstalk is suppressed.

CITATION LIST

Patent Literature

PTL 1: JP 2019-91724 A

SUMMARY

Technical Problem

The technique disclosed in PTL 1 requires to form an electrode on a side surface of a partition, which makes the manufacturing difficult, and as a result, the technique has a problem that suppressing crosstalk is difficult.

Solution to Problem

A display device according to an aspect of the disclosure includes a plurality of lower electrodes provided to be separated from each other, an insulating layer including at least a part provided below the plurality of lower electrodes, a partition provided between the plurality of lower electrodes, an electroluminescence layer electrically connected to the plurality of lower electrodes, the electroluminescence layer including a plurality of layers including a light-emitting layer, and an upper electrode provided above the electroluminescence layer, in which in the insulating layer, a gap that is a groove or a hole is formed below between the plurality of lower electrodes, at least a part of an inner wall of the insulating layer defining the gap includes a reverse tapered portion, and a target layer that is at least one layer of the electroluminescence layer located below the light-emitting layer includes a part of a region, the part of the region being formed between the plurality of lower electrodes and the partition, and a first portion and a second portion at least across at least one of a non-formation portion of the target layer and a region where the target layer is thinner than the target layer on the plurality of lower electrodes in the reverse tapered portion.

A manufacturing method of a display device according to an aspect of the disclosure includes providing a first insulating film that is a part of an insulating layer formed with a gap that is a groove or a hole, the providing the first insulating film including forming a first reverse tapered portion in at least a part of an inner wall of the insulating layer defining the gap, providing a second insulating film that is a part of the insulating layer, the providing the second insulating film including forming a forward tapered portion on a part of the inner wall of the insulating layer defining the gap, forming a contact electrode along the forward tapered portion, forming a first lower electrode and a second lower electrode, the first lower electrode electrically connected to the contact electrode, the second lower electrode being adjacent to the first lower electrode across above at least a part of the gap, forming at least one layer of an electroluminescence layer electrically connected to the first lower electrode and the second lower electrode, the electroluminescence layer including a plurality of layers including a light-emitting layer, the forming the at least one layer of the electroluminescence layer including forming a target layer that is at least one layer of the electroluminescence layer located below the light-emitting layer in a portion other than at least a part of the first reverse tapered portion, and forming a partition between the first lower electrode and the second lower electrode to fill the gap.

Advantageous Effects of Disclosure

According to an aspect of the disclosure, crosstalk can be suppressed.

BRIEF DESCRIPTION OF DRAWINGS

FIG. 11 is cross-sectional views illustrating a first step to a third step of a manufacturing method of a display device according to an eighth embodiment of the disclosure.

DESCRIPTION OF EMBODIMENTS

Figure 1:
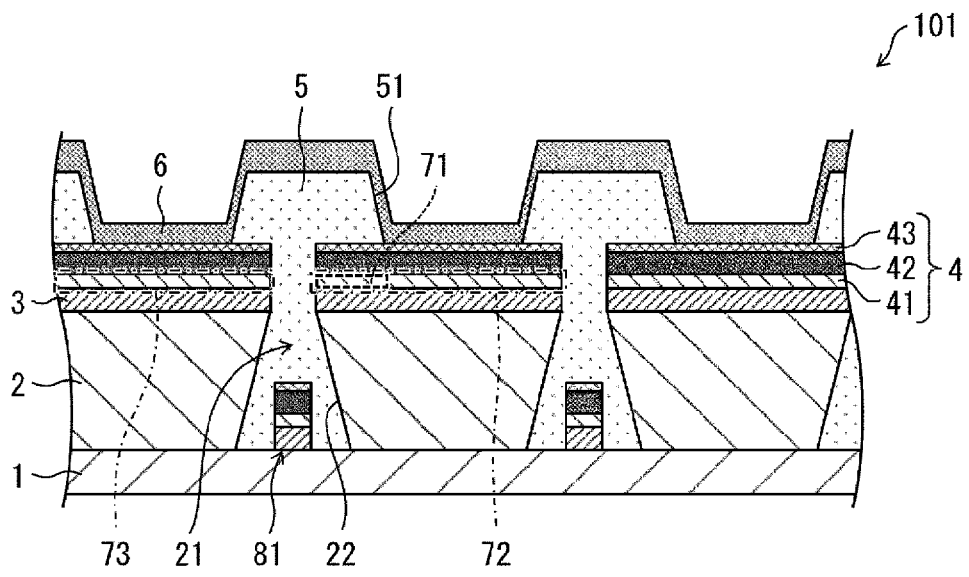
FIG. 1 is a cross-sectional view illustrating a schematic configuration of a display device according to a first embodiment of the disclosure.

Embodiments of the disclosure will be described below. Note that, for convenience of description, members having the same functions as the members described earlier may be denoted by the same reference numerals and signs, and the description thereof will not be repeated.

First Embodiment

Figure 2:
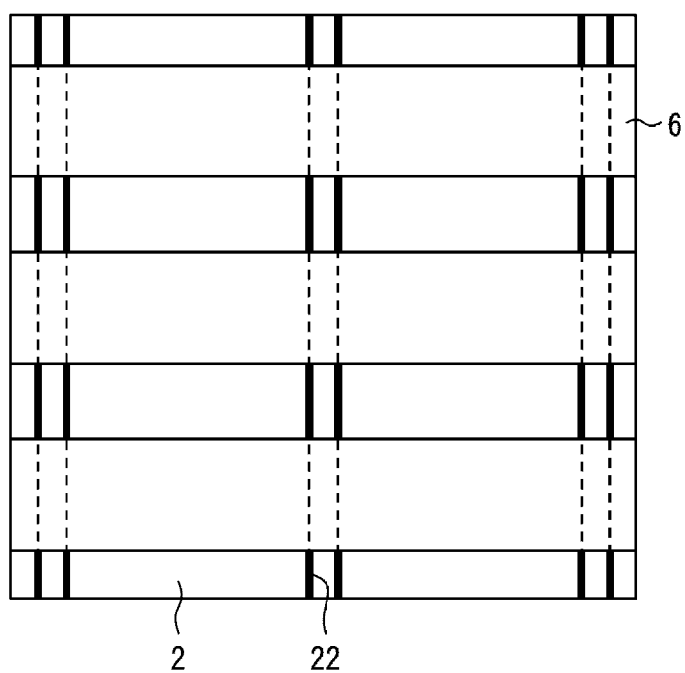
FIG. 2 is a plan view illustrating a schematic configuration of an insulating layer and an upper electrode of a display device according to the first embodiment of the disclosure.

FIG. 1 is a cross-sectional view illustrating a schematic configuration of a display device 101 according to a first embodiment of the disclosure. FIG. 2 is a plan view illustrating a schematic configuration of an insulating layer 2 and an upper electrode 6 of the display device 101 according to the first embodiment of the disclosure. In the specification of the present application, a side closer to a substrate 1 is referred to as a lower side, and a side farther from the substrate 1 is referred to as an upper side. It can be said that the upper and lower sides in the specification of the present application correspond to an upper and lower sides in a cross-sectional view of each display device.

The display device 101 illustrated in FIG. 1 includes the substrate 1, the insulating layer 2, a plurality of lower electrodes 3, an electroluminescence layer 4, a partition 5, and the upper electrode 6.

The plurality of lower electrodes 3 are provided to be separated from each other. For example, the plurality of lower electrodes 3 are provided in an island shape or a plurality of linear shapes. Examples of a material constituting the plurality of lower electrodes 3 include at least one of aluminum and indium tin oxide (ITO).

At least a part of the insulating layer 2 is provided below the plurality of lower electrodes 3. The insulating layer 2 contains a film formed of, for example, a silicon oxide (SiOx) film, a silicon nitride (SiNx) film, or a layered film thereof, and a coatable organic material such as polyimide and acrylic.

The partition 5 is provided between the plurality of lower electrodes 3. The partition 5 is provided to separate two of the plurality of lower electrodes 3 adjacent to each other from each other. Examples of the material constituting the partition 5 include an organic material such as polyimide and acrylic.

The electroluminescence layer 4 is electrically connected to the plurality of lower electrodes 3. The electroluminescence layer 4 includes a plurality of layers including a light-emitting layer 42, such as a hole transport layer 41, the light-emitting layer 42, and an electron transport layer 43.

The hole transport layer 41 is a layer for transporting positive holes from a corresponding one of the plurality of lower electrodes 3 to the light-emitting layer 42. The electron transport layer 43 is a layer for transporting electrons from the upper electrode 6 to the light-emitting layer 42. The light-emitting layer 42 emits light by a current flowing between a corresponding one of the plurality of lower electrodes 3 and the upper electrode 6. Examples of the light-emitting layer 42 include an OLED and a QLED.

The upper electrode 6 is provided above the electroluminescence layer 4. One upper electrode 6 is provided for the plurality of lower electrodes 3 in a form of surmounting the partition 5. Examples of a material constituting the upper electrode 6 include ITO and indium zinc oxide (IZO).

In the insulating layer 2, a gap 21 that is a groove or a hole is formed below between the plurality of lower electrodes 3. At least a part of an inner wall of the insulating layer 2 defining the gap 21 includes a reverse tapered portion 22. The reverse tapered portion is a portion where a wall surface defining an end portion of a member provided with the reverse tapered portion is inclined so as to be displaced to the inside of the member from an upper side toward a lower side of the corresponding display device. An angle formed by an upper surface of the substrate 1 and the reverse tapered portion or an extension thereof is an obtuse angle on the member side.

A target layer that is at least one layer of the electroluminescence layer 4 located below the light-emitting layer 42 has the following configuration. In the display device 101, the target layer is the hole transport layer 41.

A part of a region 71 of the target layer is formed between the plurality of lower electrodes 3 and the partition 5. The target layer is not formed in at least a part of the reverse tapered portion 22. The target layer includes a first portion 72 and a second portion 73 at least across a non-formation portion of the target layer in the reverse tapered portion 22. Note that the space between the first portion 72 and the second portion 73 is a space in a path from above one of two of the plurality of lower electrodes 3 adjacent to each other to above the other of the two via various members (in the display device 101, the inner wall of the insulating layer 2 and the upper surface of the substrate 1) defining the gap 21.

According to the above-described configuration, an insulating property between the plurality of lower electrodes 3, specifically, the insulating property between the first portion 72 and the second portion 73 can be easily increased by the reverse tapered portion 22. Thus, crosstalk due to the plurality of lower electrodes 3 can be suppressed. Since the above-described configuration does not require to form a layer on the reverse tapered portion 22, manufacture of the display device 101 is not difficult.

Note that the target layer may include the first portion 72 and the second portion 73 at least across a region where the target layer in the reverse tapered portion 22 is thinner than the target layer on the plurality of lower electrodes 3. That is, a region where the target layer in the reverse tapered portion 22 is thinner than the target layer on the plurality of lower electrodes 3 may be present between the first portion 72 and the second portion 73, instead of the non-formation portion of the target layer in the reverse tapered portion 22, or both of them may be present.

In the display device 101, at least a part of a portion of the partition 5 located above the plurality of lower electrodes 3 is a forward tapered portion 51. The forward tapered portion is a portion where a wall surface defining an end portion of a member provided with the forward tapered portion is inclined so as to be displaced to the inside of the member from the lower side toward the upper side of the corresponding display device. An angle formed by the upper surface of the substrate 1 and the forward tapered portion or an extension thereof is an acute angle on the member side.

An example of a manufacturing method of the display device 101 is as follows. First, after the insulating layer 2 including the reverse tapered portion 22 is formed on the substrate 1, the plurality of lower electrodes 3 and the electroluminescence layer 4 are formed by a known process.

Subsequently, the partition 5 is formed. Subsequently, the upper electrode 6 is formed. In the display device 101 manufactured by the example of the manufacturing method, a residue 81 containing the material constituting the plurality of lower electrodes 3, a material constituting the hole transport layer 41, a material constituting the light-emitting layer 42, and a material constituting the electron transport layer 43 is present in the gap 21. Note that the residue 81 and residues 82 and 83 described later are literally so-called residues and are not included in the target layer.

The first portion 72 and the second portion 73 are preferably discontinuous from each other. Specifically, the first portion 72 and the second portion 73 are preferably not connected to each other via a part of the target layer. As a result, the crosstalk due to the plurality of lower electrodes 3 can be further suppressed.

A part of the light-emitting layer 42 is located between the plurality of lower electrodes 3 and the partition 5. The part of the light-emitting layer 42 includes a portion of the light-emitting layer 42 where unevenness of a film formation state is likely to occur, such as an edge of the light-emitting layer 42 and a portion where torsion and/or thickness unevenness may occur in the light-emitting layer 42. As a result, the portion of the light-emitting layer 42 where unevenness of the film formation state is likely to occur can be covered with the partition 5 so as not to contribute to light emission, and thus the display device 101 with favorable performance can be realized.

The insulating layer 2 preferably contains fluorine. As a result, a liquid-repellent property of the insulating layer 2 can be enhanced, and thus the crosstalk due to the plurality of lower electrodes 3 caused by the material constituting the hole transport layer 41 unintentionally adhering to the insulating layer 2 can be suppressed.

A material constituting the first portion 72 and a material constituting the second portion 73 are the same. Thus, the first portion 72 and the second portion 73 can be collectively formed by a known process.

According to FIG. 2, the insulating layer 2 is formed in a stripe shape (a plurality of stripes), and the reverse tapered portion 22 is formed at a respective one of end portions on each side of adjacent stripes in each stripe. The upper electrode 6 is formed so as to straddle the plurality of stripes substantially along the short-hand direction of each stripe.

Second Embodiment

Figure 3:
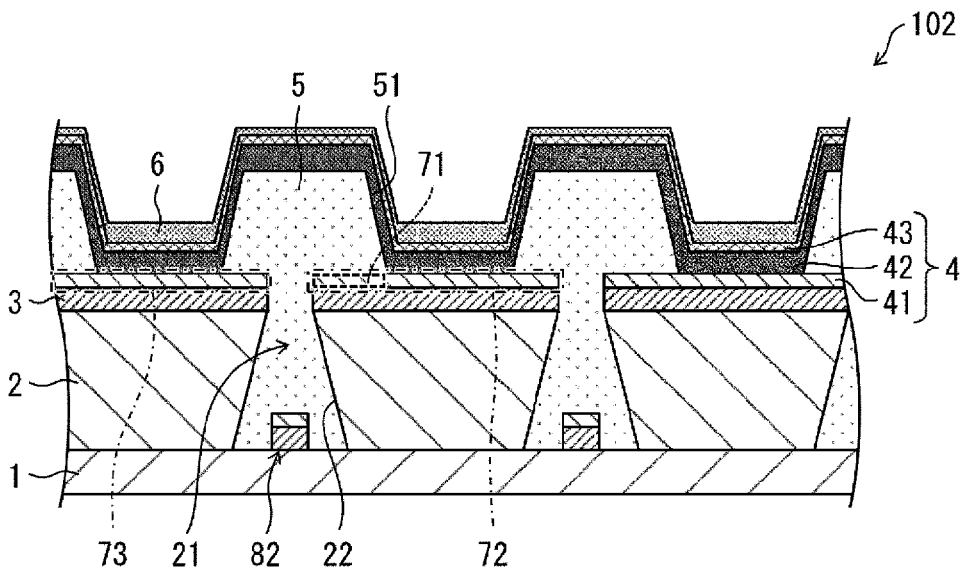
FIG. 3 is a cross-sectional view illustrating a schematic configuration of a display device according to a second embodiment of the disclosure.

FIG. 3 is a cross-sectional view illustrating a schematic configuration of a display device 102 according to a second embodiment of the disclosure.

The difference in the configuration of the display device 102 with respect to the configuration of the display device 101 is as follows.

In the display device 102, at least one of the plurality of layers included in the electroluminescence layer 4 is located between the partition 5 and the upper electrode 6. In the display device 102, one light-emitting layer 42 and one electron transport layer 43 are provided for the plurality of lower electrodes 3 in a form of surmounting the partition 5. In the display device 102, a layered structure of the partition 5, the light-emitting layer 42, the electron transport layer 43, and the upper electrode 6 is formed in this order from the lower side. As a result, a voltage drop in the upper electrode 6 in a direction in which a current flows in the upper electrode 6 can be suppressed, and thus an IR drop (luminance unevenness) can be suppressed.

An example of a manufacturing method of the display device 102 is as follows. First, after the insulating layer 2 including the reverse tapered portion 22 is formed on the substrate 1, the plurality of lower electrodes 3 and the hole transport layer 41 are formed by a known process. Subsequently, the partition 5 is formed. Subsequently, the light-emitting layer 42, the electron transport layer 43, and the upper electrode 6 are formed. In the display device 102 manufactured by the example of the manufacturing method, the residue 82 containing the material constituting the plurality of lower electrodes 3, and the material constituting the hole transport layer 41 is present in the gap 21.

Third Embodiment

Figure 4:
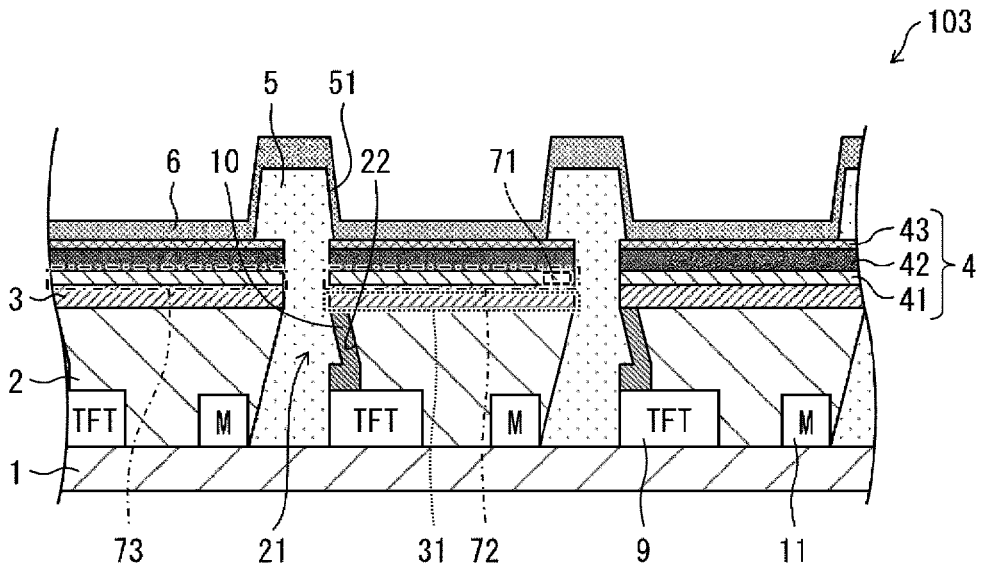
FIG. 4 is a cross-sectional view illustrating a schematic configuration of a display device according to a third embodiment of the disclosure.
Figure 5:
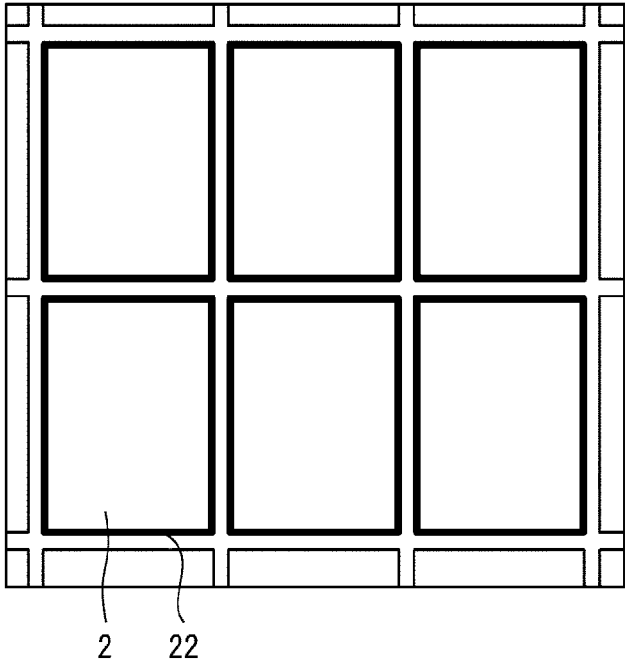
FIG. 5 is a plan view illustrating a schematic configuration of an insulating layer of a display device according to the third embodiment of the disclosure.

FIG. 4 is a cross-sectional view illustrating a schematic configuration of a display device 103 according to a third embodiment of the disclosure. FIG. 5 is a plan view illustrating a schematic configuration of the insulating layer 2 of the display device 103 according to the third embodiment of the disclosure.

The difference in the configuration of the display device 103 with respect to the configuration of the display device 101 is as follows.

A first lower electrode 31 that is one of the plurality of lower electrodes 3 will be discussed. The display device 103 includes a thin film transistor (TFT) 9, a contact electrode 10, and a metal wiring line 11. The TFT 9 is electrically connected to the first lower electrode 31 by the contact electrode 10. The contact electrode 10 is formed along the reverse tapered portion 22 of the insulating layer 2.

Although the display device 101 is a so-called passive matrix type, the display device 103 is a so-called active matrix type. The display device 103 that is the active matrix type includes the TFT 9 electrically connected to the first lower electrode 31 that is one of the plurality of lower electrodes 3. As a result, the load on the various members constituting the display device 103 can be reduced, and thus the display device 103 having a long lifetime can be realized.

In the display device 103, the contact electrode 10 can be formed by, for example, oblique deposition (sputtering).

According to FIG. 5, the insulating layers 2 are each formed in an island shape, and the reverse tapered portion 22 is formed at a respective one of end portions of each island.

Fourth Embodiment

Figure 6:
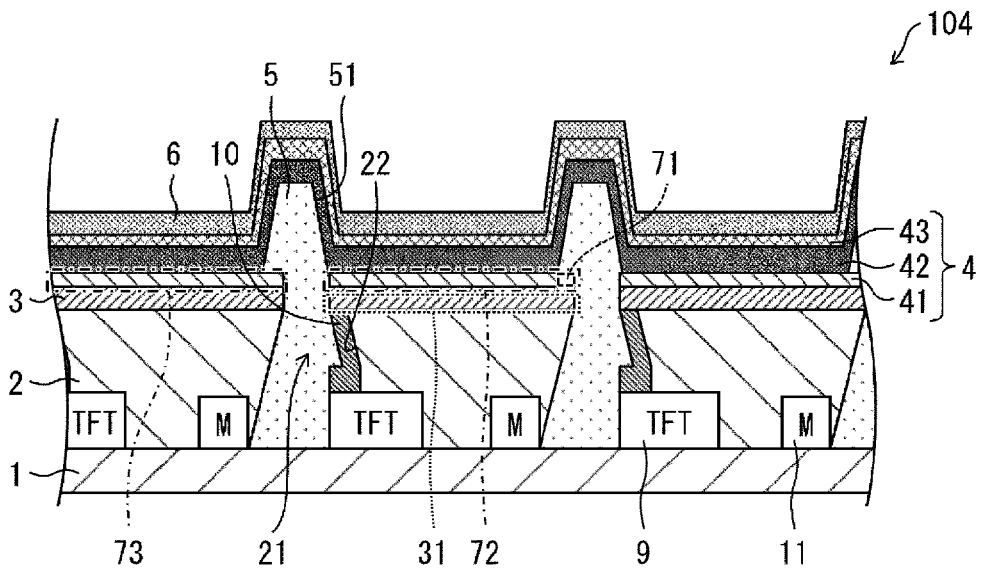
FIG. 6 is a cross-sectional view illustrating a schematic configuration of a display device according to a fourth embodiment of the disclosure.

FIG. 6 is a cross-sectional view illustrating a schematic configuration of a display device 104 according to a fourth embodiment of the disclosure.

The difference in the configuration of the display device 104 with respect to the configuration of the display device 103 is as follows.

In the display device 104, at least one of the plurality of layers included in the electroluminescence layer 4 is located between the partition 5 and the upper electrode 6 in the same manner as illustrated in the display device 102. As a result, the IR drop (luminance unevenness) can be suppressed.

Fifth Embodiment

Figure 7:
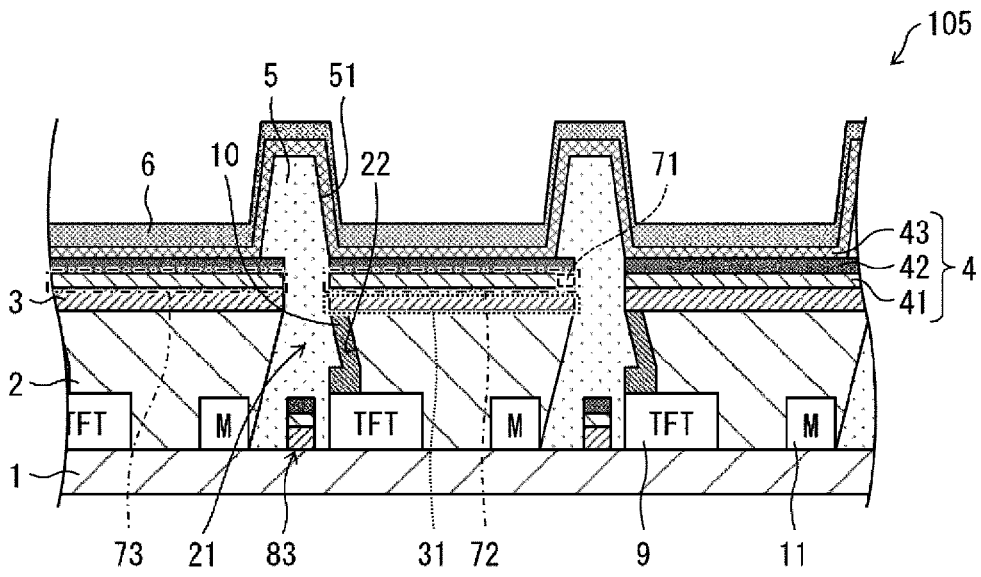
FIG. 7 is a cross-sectional view illustrating a schematic configuration of a display device according to a fifth embodiment of the disclosure.

FIG. 7 is a cross-sectional view illustrating a schematic configuration of a display device 105 according to a fifth embodiment of the disclosure.

The difference in the configuration of the display device 105 with respect to the configuration of the display device 104 is as follows.

In the display device 105, at least one of the plurality of layers included in the electroluminescence layer 4 is located between the partition 5 and the upper electrode 6, and in this respect, the display device 105 is the same as the display device 104.

On the other hand, in the display device 104, one light-emitting layer 42 is provided for the plurality of lower electrodes 3 in the form of surmounting the partition 5, but in the display device 105, the light-emitting layer 42 is not provided in the form of surmounting the partition 5. In the display device 105, a part of the light-emitting layer 42 is located between the plurality of lower electrodes 3 and the partition 5. As a result, the portion of the light-emitting layer 42 where unevenness of the film formation is likely to occur can be covered with the partition 5 so as not to contribute to light emission, and thus the display device 105 with favorable performance can be realized.

In the display device 105, the residue 83 containing the material constituting the plurality of lower electrodes 3, the material constituting the hole transport layer 41, and the material constituting the light-emitting layer 42 is present in the gap 21.

Sixth Embodiment

Figure 8:
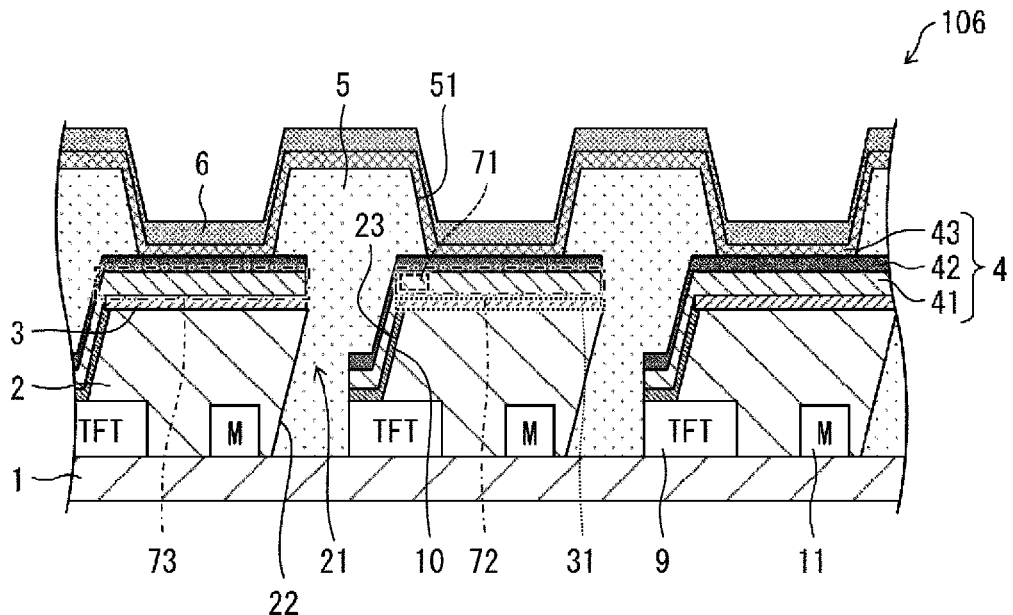
FIG. 8 is a cross-sectional view illustrating a schematic configuration of a display device according to a sixth embodiment of the disclosure.
Figure 9:
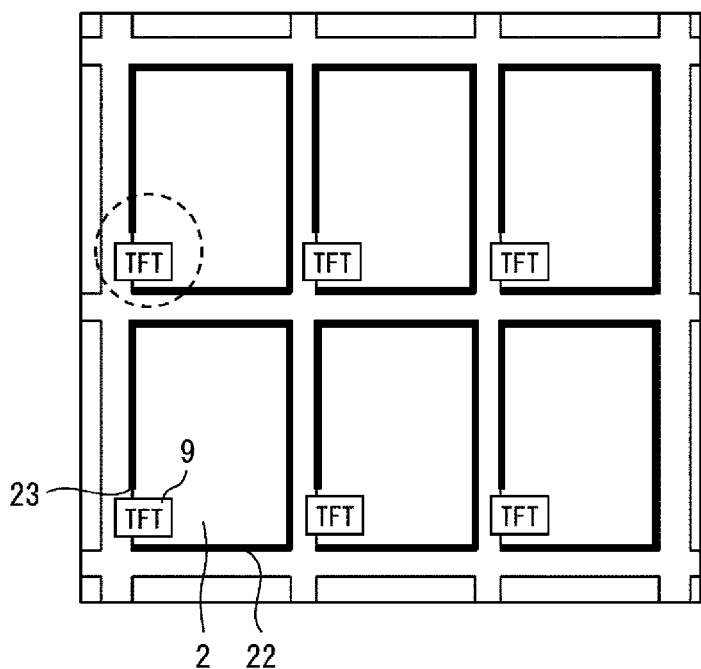
FIG. 9 is a plan view illustrating a schematic configuration of insulating layers and transistors of a display device according to the sixth embodiment of the disclosure.

FIG. 8 is a cross-sectional view illustrating a schematic configuration of a display device 106 according to a sixth embodiment of the disclosure. FIG. 9 is a plan view illustrating a schematic configuration of the insulating layer 2 and the TFT 9 of the display device 106 according to the sixth embodiment of the disclosure.

The difference in the configuration of the display device 106 with respect to the configuration of the display device 105 is as follows.

A part of the inner wall of the insulating layer 2 defining the gap 21 includes a forward tapered portion 23. The first lower electrode 31 and the TFT 9 are electrically connected to each other along the forward tapered portion 23 by the contact electrode 10. As a result, the possibility that the contact electrode 10 formed on the insulating layer 2 is disconnected is reduced, and thus the possibility that the electrical connection between the first lower electrode 31 and the TFT 9 becomes defective can be reduced.

According to FIG. 9, the insulating layers 2 are each formed in an island shape, and the reverse tapered portion 22 is formed at a respective one of end portions of each island. However, the reverse tapered portion 22 is not formed and the forward tapered portion 23 is formed in a mounting portion of the TFT 9 at the end portion and in the vicinity thereof of each island.

Seventh Embodiment

Figure 10:
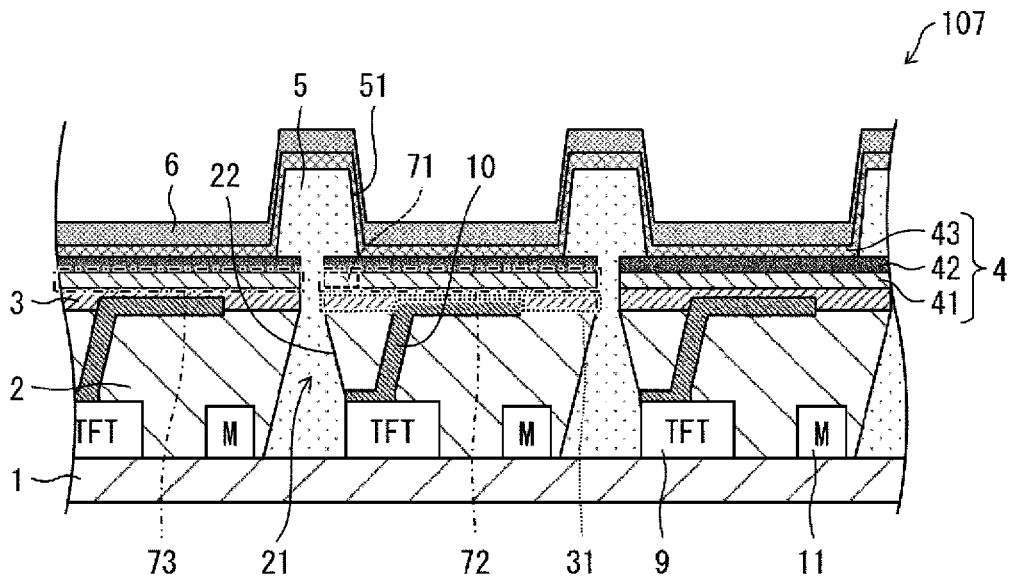
FIG. 10 is a cross-sectional view illustrating a schematic configuration of a display device according to a seventh embodiment of the disclosure.

FIG. 10 is a cross-sectional view illustrating a schematic configuration of a display device 107 according to a seventh embodiment of the disclosure.

The difference in the configuration of the display device 107 with respect to the configuration of the display device 105 is as follows.

In the display device 107, the first lower electrode 31 and the TFT 9 are electrically connected to each other at an outside of the gap 21 by the contact electrode 10 embedded in the insulating layer 2. As a result, a size of an upper end of the gap 21 can be reduced, and thus the display device 107 having a high aperture ratio can be realized.

Eighth Embodiment

Figure 12:
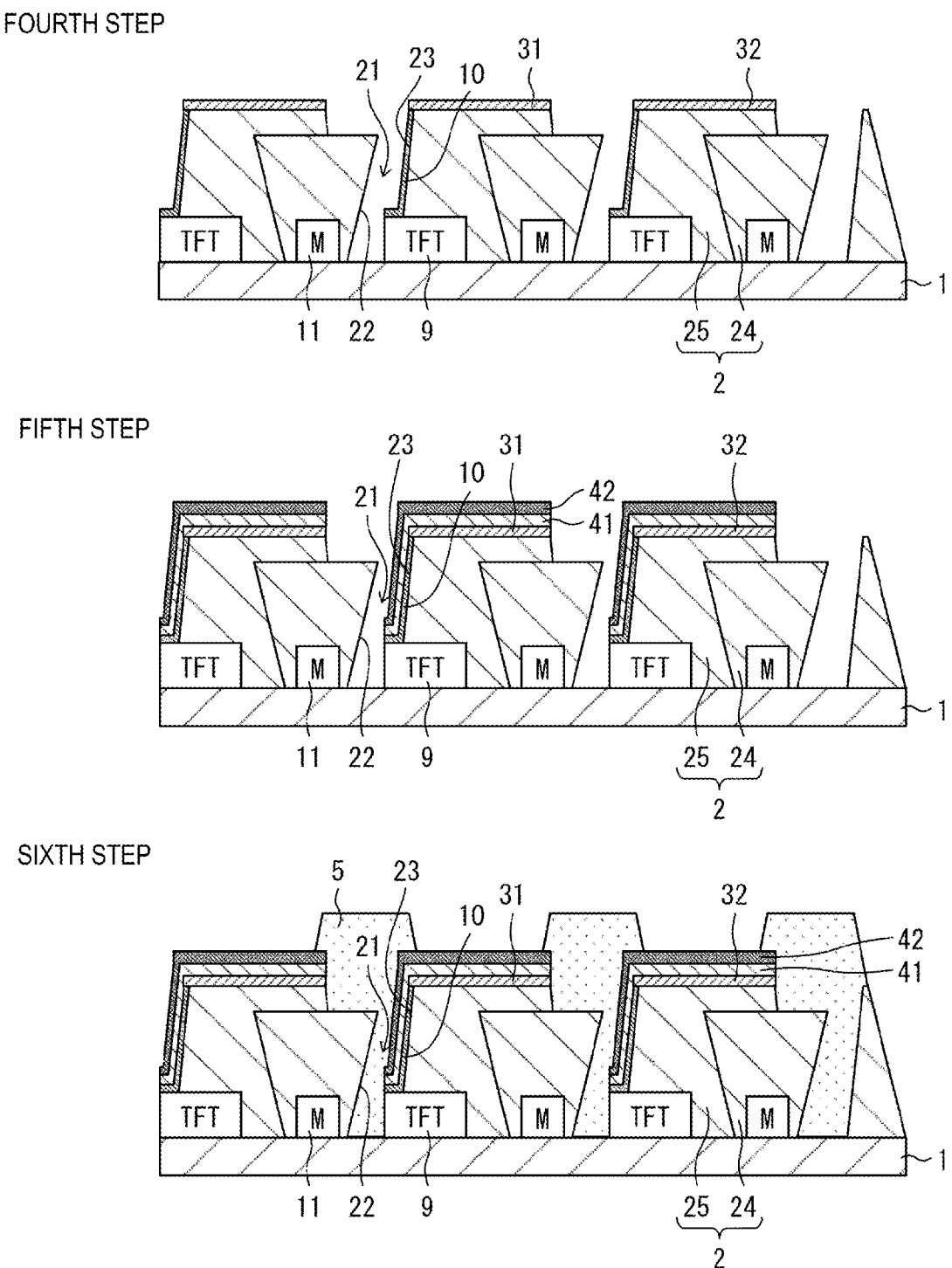
FIG. 12 is cross-sectional views illustrating a fourth step to a sixth step of the manufacturing method of the display device according to the eighth embodiment of the disclosure.

FIG. 11 is cross-sectional views illustrating a first step to a third step of a manufacturing method of a display device according to an eighth embodiment of the disclosure. FIG. 12 is cross-sectional views illustrating a fourth step to a sixth step of the manufacturing method of the display device according to the eighth embodiment of the disclosure.

The manufacturing method of the display device according to the present embodiment includes the first step to the sixth step.

First step: A first insulating film 24 that is a part of the insulating layer 2 in which the gap 21 that is a groove or a hole is formed is provided on the substrate 1 provided with the TFT 9 and the metal wiring line 11. Here, the reverse tapered portion 22 is formed on at least a part of the inner wall of the insulating layer 2 defining the gap 21. The reverse tapered portion 22 formed in the first step corresponds to a first reverse tapered portion.

Second step: A second insulating film 25 that is a part of the insulating layer 2 is provided. Here, the forward tapered portion 23 is formed on a part of the inner wall of the insulating layer 2 defining the gap 21.

In the second step, a negative photoresist 26 is coated from above the first insulating film 24 to fill the first insulating film 24, and an upper side of the reverse tapered portion 22 is covered using a photomask 12 and the photoresist 26 is exposed. Subsequently, by performing development, the forward tapered portion 23 is formed by the photoresist 26, and the second insulating film 25 is completed. In the display device according to the present embodiment, a combination of the first insulating film 24 and the second insulating film 25 corresponds to the insulating layer 2.

Note that, in the insulating layer 2 formed in the second step, a step 231 is formed in the forward tapered portion 23. The step 231 is preferably reduced or eliminated as much as possible by increasing the thickness of the photoresist 26 to be coated or exposing the photoresist 26 by halftone exposure. Alternatively, the forward tapered portion 23 may be formed by oblique exposure. For convenience of description, the description will be performed by assuming that there is no step 231 in the third and subsequent steps.

A positive photoresist may be used as the photoresist 26 instead of the negative photoresist.

Third step: The contact electrode 10 electrically connected to the TFT 9 is formed along the forward tapered portion 23.

Fourth step: The first lower electrode 31 electrically connected to the contact electrode 10 and a second lower electrode 32 adjacent to the first lower electrode 31 across above at least a part of the gap 21 are formed. The second lower electrode 32 is one of the plurality of lower electrodes 3. Note that the third step and the fourth step may be collectively performed.

Fifth step: At least one layer in the electroluminescence layer 4 including the plurality of layers including the light-emitting layer 42 electrically connected to the first lower electrode 31 and the second lower electrode 32 is formed. Here, a target layer (here, the hole transport layer 41) that is at least one layer of the electroluminescence layer 4 located below the light-emitting layer 42 is formed other than at least a part of the reverse tapered portion 22. In the example illustrated in FIG. 12, in the fifth step, the light-emitting layer 42 is formed in addition to the hole transport layer 41, but which layer in the electroluminescence layer 4 is formed in the fifth step depends on each embodiment described above.

Sixth step: The partition 5 is formed between the first lower electrode 31 and the second lower electrode 32 so as to fill the gap 21.

After the sixth step, the non-formation portion in the electroluminescence layer 4 and the upper electrode 6 are formed in this order to complete the display device according to the present embodiment. The display device has substantially the same configuration as the display device 106. According to the manufacturing method of the display device, a favorable yield with respect to the electrical connection between the TFT 9 and the first lower electrode 31 can be realized.

In the fifth step, the target layer is preferably formed by solution coating. As a result, a manufacturing cost of the target layer and thus the display device according to the present embodiment can be reduced.

The fourth step may include an electrode forming step of collectively forming the first lower electrode 31 and the second lower electrode 32 across above at least a part of the gap 21 without using a photomask. Examples of a method for collectively forming the first lower electrode 31 and the second lower electrode 32 without using the photomask include vapor deposition and sputtering. In the electrode forming step, the first lower electrode 31 and the second lower electrode 32 may be separated from each other. As a result, a patterning step is not required in the formation of the first lower electrode 31 and the second lower electrode 32.

The first insulating film 24 preferably contains fluorine. As a result, a liquid-repellent property of the insulating layer 2 can be enhanced, and thus the crosstalk due to the plurality of lower electrodes 3 caused by the material constituting the hole transport layer 41 unintentionally adhering to the insulating layer 2 can be suppressed.

Ninth Embodiment

Figure 13:
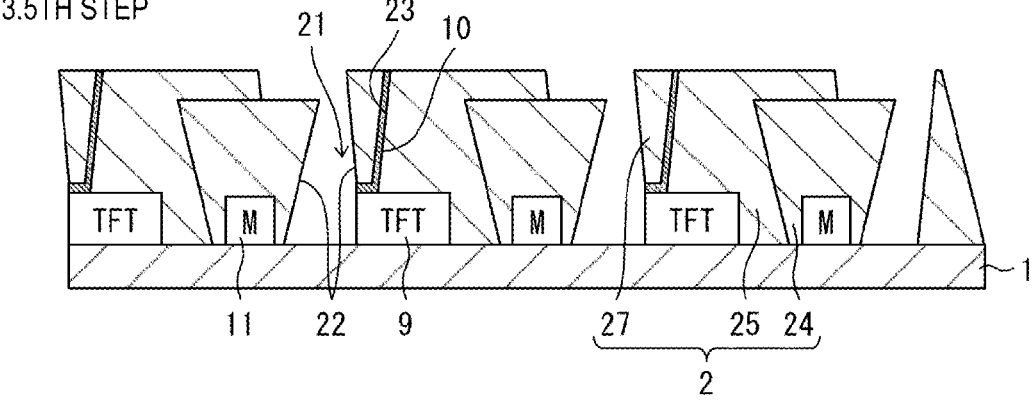
FIG. 13 is a cross-sectional view illustrating a 3.5th step of a manufacturing method of a display device according to a ninth embodiment of the disclosure.

FIG. 13 is a cross-sectional view illustrating a 3.5th step of the manufacturing method of the display device according to a ninth embodiment of the disclosure.

The manufacturing method of the display device according to the present embodiment includes the first step to the sixth step described above and the 3.5th step. The 3.5th step corresponds to a step after the third step and before the fourth step.

3.5th step: A third insulating film 27 that is a part of the insulating layer 2 is provided on the contact electrode 10. Here, the third insulating film 27 includes the reverse tapered portion 22 on a part of the inner wall of the insulating layer 2 defining the gap 21. The reverse tapered portion 22 formed in the 3.5th step corresponds to a second reverse tapered portion.

In the 3.5th step, the reverse tapered portion 22 may be formed by oblique exposure. In the display device according to the present embodiment, a combination of the first insulating film 24, the second insulating film 25, and the third insulating film 27 corresponds to the insulating layer 2.

The display device according to the present embodiment has substantially the same configuration as the display device 107. According to the manufacturing method of the display device, a favorable yield with respect to the electrical connection between the TFT 9 and the first lower electrode 31 can be realized.

The third insulating film 27 preferably contains fluorine. As a result, a liquid-repellent property of the insulating layer 2 can be enhanced, and thus the crosstalk due to the plurality of lower electrodes 3 caused by the material constituting the hole transport layer 41 unintentionally adhering to the insulating layer 2 can be suppressed.

APPENDIX

One of the points in each embodiment is that the target layer is intentionally disconnected as a result of a step for each of the plurality of lower electrodes 3 and thus for each pixel of the display device by the shape of the insulating layer 2 (for example, the reverse tapered portion 22). Accordingly, the crosstalk is suppressed, and as a result, a display device having advantages such as high luminance, a long lifetime, and high reliability can be realized.

In each embodiment, for example, when the insulating layer 2 contains fluorine, there is a case where no residue is generated. The presence or absence of the residue in each display device is not particularly limited.

An insulating film other than the insulating layer 2 may be provided below the plurality of lower electrodes 3.
Supplement A display device according to a first aspect of the disclosure includes a plurality of lower electrodes provided to be separated from each other, an insulating layer including at least a part provided below the plurality of lower electrodes, a partition provided between the plurality of lower electrodes, an electroluminescence layer electrically connected to the plurality of lower electrodes, the electroluminescence layer including a plurality of layers including a light-emitting layer, and an upper electrode provided above the electroluminescence layer, in which in the insulating layer, a gap that is a groove or a hole is formed below between the plurality of lower electrodes, at least a part of an inner wall of the insulating layer defining the gap includes an reverse tapered portion, and a target layer that is at least one layer of the electroluminescence layer located below the light-emitting layer includes a part of a region, the part of the region being formed between the plurality of lower electrodes and the partition, and a first portion and a second portion at least across at least one of a non-formation portion of the target layer and a region where the target layer is thinner than the target layer on the plurality of lower electrodes in the reverse tapered portion.

According to the above-described configuration, an insulating property between the plurality of lower electrodes, specifically, the insulating property between the first portion and the second portion can be easily increased by the reverse tapered portion. Thus, crosstalk due to the plurality of lower electrodes can be suppressed.

In the display device according to a second aspect of the disclosure in the first aspect, at least a part of a portion of the partition located above the plurality of lower electrodes is a forward tapered portion.

The display device according to a third aspect of the disclosure in the first or second aspect further includes a transistor (TFT 9) electrically connected to a first lower electrode that is one of the plurality of lower electrodes.

According to the above-described configuration, the load on the various members constituting the display device can be reduced, and thus the display device having a long lifetime can be realized.

In the display device according to a fourth aspect of the disclosure in the third aspect, a part of the inner wall of the insulating layer defining the gap includes a forward tapered portion, and the first lower electrode and the transistor are electrically connected to each other along the forward tapered portion.

According to the above-described configuration, the possibility that the electrical connection between the first lower electrode and the transistor becomes defective can be reduced.

In the display device according to a fifth aspect of the disclosure in the third aspect, the first lower electrode and the transistor are electrically connected to each other at an outside of the gap by a contact electrode embedded in the insulating layer.

According to the above-described configuration, a size of an upper end of the gap can be reduced, and thus the display device with a high aperture ratio can be realized.

In the display device according to a sixth aspect of the disclosure in any one of the first to fifth aspects, the first portion and the second portion are discontinuous from each other.

According to the above-described configuration, the crosstalk due to the plurality of lower electrodes can be further suppressed.

In the display device according to a seventh aspect of the disclosure in any one of the first to sixth aspects, at least one of the plurality of layers included in the electroluminescence layer is located between the partition and the upper electrode.

According to the above-described configuration, a voltage drop in the upper electrode in a direction in which a current flows in the upper electrode can be suppressed, and thus an IR drop (luminance unevenness) can be suppressed.

In the display device according to an eighth aspect of the disclosure in any one of the first to seventh aspects, a part of the light-emitting layer is located between the plurality of lower electrodes and the partition.

According to the above-described configuration, the portion of the light-emitting layer where unevenness of the film formation state is likely to occur can be covered with the partition so as not to contribute to light emission, and thus the display device with favorable performance can be realized.

In the display device according to a ninth aspect of the disclosure in any one of the first to eighth aspects, the insulating layer contains fluorine.

According to the above-described configuration, a liquid-repellent property of the insulating layer can be enhanced, and thus the crosstalk due to the plurality of lower electrodes caused by the material constituting the target layer unintentionally adhering to the insulating layer can be suppressed.

In the display device according to a tenth aspect of the disclosure in any one of the first to ninth aspects, a material constituting the first portion and a material constituting the second portion are the same.

According to the above-described configuration, the first portion and the second portion can be collectively formed by a known process.

A manufacturing method of a display device according to an eleventh aspect of the disclosure includes providing a first insulating film that is a part of an insulating layer formed with a gap that is a groove or a hole, the providing the first insulating film including forming a first reverse tapered portion in at least a part of an inner wall of the insulating layer defining the gap, providing a second insulating film that is a part of the insulating layer, the providing the second insulating film including forming a forward tapered portion on a part of the inner wall of the insulating layer defining the gap, forming a contact electrode along the forward tapered portion, forming a first lower electrode and a second lower electrode, the first lower electrode electrically connected to the contact electrode, the second lower electrode being adjacent to the first lower electrode across above at least a part of the gap, forming at least one layer of an electroluminescence layer electrically connected to the first lower electrode and the second lower electrode, the electroluminescence layer including a plurality of layers including a light-emitting layer, the forming the at least one layer of the electroluminescence layer including forming a target layer that is at least one layer of the electroluminescence layer located below the light-emitting layer in a portion other than at least a part of the first reverse tapered portion, and forming a partition between the first lower electrode and the second lower electrode to fill the gap.

According to the above-described configuration, a favorable yield with respect to the electrical connection between the first lower electrode and another member can be realized.

The manufacturing method of a display device according to a twelfth aspect of the disclosure in the eleventh aspect further includes providing on the contact electrode a third insulating film that is a part of the insulating layer after the forming the contact electrode.

In the manufacturing method of a display device according to a thirteenth aspect of the disclosure in the twelfth aspect, the third insulating film includes a second reverse tapered portion on a part of the inner wall of the insulating layer defining the gap.

According to the above-described configuration, a size of an upper end of the gap can be reduced, and thus the display device with a high aperture ratio can be manufactured.

In the manufacturing method of a display device according to a fourteenth aspect of the disclosure in the twelfth or thirteenth aspect, the third insulating film contains fluorine.

According to the above-described configuration, a liquid-repellent property of the insulating layer can be enhanced, and thus the crosstalk due to the first lower electrode and the second lower electrode caused by the material constituting the target layer unintentionally adhering to the insulating layer can be suppressed.

In the manufacturing method of a display device according to a fifteenth aspect of the disclosure in any one of the eleventh to fourteenth aspects, the forming the target layer is performed by solution coating in the forming the at least one layer of the electroluminescence layer.

According to the above-described configuration, a manufacturing cost of the target layer and thus the display device can be reduced.

In the manufacturing method of a display device according to a sixteenth aspect of the disclosure in any one of the eleventh to fifteenth aspects, the forming the first lower electrode and the second lower electrode includes collectively forming the first lower electrode and the second lower electrode across above the at least the part of the gap without using a photomask, and the first lower electrode and the second lower electrode are separated from each other in the collectively forming the first lower electrode and the second lower electrode.

According to the above-described configuration, a patterning step is not required in the formation of the first lower electrode and the second lower electrode.

In the manufacturing method of a display device according to a seventeenth aspect of the disclosure in any one of the eleventh to sixteenth aspects, the first insulating film contains fluorine.

According to the above-described configuration, a liquid-repellent property of the insulating layer can be enhanced, and thus the crosstalk due to the first lower electrode and the second lower electrode caused by the material constituting the target layer unintentionally adhering to the insulating layer can be suppressed.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
a plurality of lower electrodes provided to be separated from each other;
an insulating layer including at least a part provided below the plurality of lower electrodes;
a partition provided between the plurality of lower electrodes;
an electroluminescence layer electrically connected to the plurality of lower electrodes, the electroluminescence layer including a plurality of layers including a light-emitting layer; and
an upper electrode provided above the electroluminescence layer,
wherein in the insulating layer, a gap that is a groove or a hole is formed below between the plurality of lower electrodes,
at least a part of an inner wall of the insulating layer defining the gap includes a reverse tapered portion, and
a target layer that is at least one layer of the electroluminescence layer located below the light-emitting layer includes
a part of a region, the part of the region being formed between the plurality of lower electrodes and the partition, and
a first portion and a second portion at least across at least one of a non-formation portion of the target layer and a region where the target layer is thinner than the target layer on the plurality of lower electrodes in the reverse tapered portion.

2. The display device according to claim 1,
wherein at least a part of a portion of the partition located above the plurality of lower electrodes is a forward tapered portion.

3. The display device according to claim 1 further comprising
a transistor electrically connected to a first lower electrode that is one of the plurality of lower electrodes.

4. The display device according to claim 3,
wherein a part of the inner wall of the insulating layer defining the gap includes a forward tapered portion, and
the first lower electrode and the transistor are electrically connected to each other along the forward tapered portion.

5. The display device according to claim 3,
wherein the first lower electrode and the transistor are electrically connected to each other at an outside of the gap by a contact electrode embedded in the insulating layer.

6. The display device according to claim 1,
wherein the first portion and the second portion are discontinuous from each other.

7. The display device according to claim 1, wherein at least one of the plurality of layers included in the electroluminescence layer is located between the partition and the upper electrode.

8. The display device according to claim 1,
wherein a part of the light-emitting layer is located between the plurality of lower electrodes and the partition.

9. The display device according to claim 1,
wherein the insulating layer contains fluorine.

10. The display device according to claim 1,
wherein a material constituting the first portion and a material constituting the second portion are the same.

11. A manufacturing method of a display device, the manufacturing method comprising:
providing a first insulating film that is a part of an insulating layer formed with a gap that is a groove or a hole, the providing the first insulating film including forming a first reverse tapered portion in at least a part of an inner wall of the insulating layer defining the gap;
providing a second insulating film that is a part of the insulating layer, the providing the second insulating film including forming a forward tapered portion on a part of the inner wall of the insulating layer defining the gap;
forming a contact electrode along the forward tapered portion;
forming a first lower electrode and a second lower electrode, the first lower electrode electrically connected to the contact electrode, the second lower electrode being adjacent to the first lower electrode across above at least a part of the gap;
forming at least one layer of an electroluminescence layer electrically connected to the first lower electrode and the second lower electrode, the electroluminescence layer including a plurality of layers including a light-emitting layer, the forming the at least one layer of the electroluminescence layer including forming a target layer that is at least one layer of the electroluminescence layer located below the light-emitting layer in a portion other than at least a part of the first reverse tapered portion; and
forming a partition between the first lower electrode and the second lower electrode to fill the gap.

12. The manufacturing method of a display device according to claim 11 further comprising
providing on the contact electrode a third insulating film that is a part of the insulating layer after the forming the contact electrode.

13. The manufacturing method of a display device according to claim 12,
wherein the third insulating film includes a second reverse tapered portion on a part of the inner wall of the insulating layer defining the gap.

14. The manufacturing method of a display device according to claim 12,
wherein the third insulating film contains fluorine.

15. The manufacturing method of a display device according to claim 11,
wherein the forming the target layer is performed by solution coating in the forming the at least one layer of the electroluminescence layer.

16. The manufacturing method of a display device according to claim 11,
wherein the forming the first lower electrode and the second lower electrode includes collectively forming the first lower electrode and the second lower electrode across above the at least the part of the gap without using a photomask, and the first lower electrode and the second lower electrode are separated from each other in the collectively forming the first lower electrode and the second lower electrode.

17. The manufacturing method of a display device according to claim 11, wherein the first insulating film contains fluorine.

* * * * *